United States Patent
Koscielnik et al.

(10) Patent No.: US 9,853,656 B2
(45) Date of Patent: Dec. 26, 2017

(54) METHOD AND APPARATUS FOR CONVERSION OF VALUE OF ANALOG SIGNAL TO COMPRESSED DIGITAL WORD

(71) Applicant: Akademia Gorniczo-Hutnicza im. Stanislawa Staszica, Crakow (PL)

(72) Inventors: Dariusz Koscielnik, Crakow (PL); Marek Miskowicz, Crakow (PL)

(73) Assignee: AKADEMIA GORNICZO-HUTNICZA IM. STANISLAWA STASZICA, Cracow (PL)

( * ) Notice: Subject to any disclaimer, the term of this patent is extended or adjusted under 35 U.S.C. 154(b) by 0 days.

(21) Appl. No.: 14/974,101

(22) Filed: Dec. 18, 2015

(65) Prior Publication Data

US 2017/0077941 A1   Mar. 16, 2017

(30) Foreign Application Priority Data

Sep. 14, 2015   (PL) ...................................... P413958
Sep. 14, 2015   (PL) ...................................... P413959

(51) Int. Cl.
*H03M 7/34*   (2006.01)
*H03M 1/38*   (2006.01)
*H03M 1/46*   (2006.01)

(52) U.S. Cl.
CPC ............. *H03M 1/38* (2013.01); *H03M 1/462* (2013.01); *H03M 1/464* (2013.01)

(58) Field of Classification Search
CPC ............ H03M 7/30; H03M 1/12; H03M 1/00; H03M 2201/4233
USPC ............................ 341/51, 155, 161, 163, 166
See application file for complete search history.

(56) References Cited

U.S. PATENT DOCUMENTS

2011/0099295 A1*   4/2011   Wegener ................. H03M 7/46
                                                                    709/247

* cited by examiner

*Primary Examiner* — Joseph Lauture
(74) *Attorney, Agent, or Firm* — Ladas & Parry LLP

(57) ABSTRACT

A method and apparatus for conversion of a time interval to a digital word, the time interval being mapped to a difference of a length of a reference time and a length of a signal time. Reference time is generated from an instant when the beginning of the time interval is detected, and the signal time is generated from an instant when the end of the time interval is detected by the use the control module. The generation of the reference time and the signal time is terminated at the same instant. In the apparatus, bottom plates of capacitors of the set of capacitors are connected to a ground of the circuit, and top plates of these capacitors are connected, respectively, to moving contacts of change-over switches. First, second, and third stationary contacts are connected to the signal rail, the ground of the circuit, and to the reference rail.

10 Claims, 2 Drawing Sheets

METHOD AND APPARATUS FOR CONVERSION OF VALUE OF ANALOG SIGNAL TO COMPRESSED DIGITAL WORD

The application claims priority to Polish Patent Application No. P413958, filed Sep. 14, 2015, and Polish Patent Application No. P413959, filed Sep. 14, 2015, both of which are incorporated herein by reference.

BACKGROUND OF THE INVENTION

The subject of this invention is a method and an apparatus for a conversion of a value of an analog signal to a compressed digital word that can be applied in monitoring and control systems.

A conversion of a voltage value to a linear digital word using a successive approximation scheme is known from the article James McCreary, Paul R. Gray "A High-Speed, All-MOS Successive-Approximation Weighted Capacitor A/D Conversion Technique", IEEE International Solid-State Circuits Conference, Feb. 12, 1975, pp. 38-39. The solution according to the aforementioned article uses a technique of charge redistribution among a number of m+1 capacitors, while m is a number of bits in the linear digital word. The capacitances of the capacitors are binary-weighted except the last capacitor whose capacitance is the same as the capacitance of the second-to-last capacitor. In the first stage of conversion, an input voltage is sampled which causes an accumulation of a charge portion in the capacitors that are connected in parallel to the input voltage, while the charge portion accumulated in the capacitors is proportional to a value of the input voltage. The accumulated charge portion is further redistributed among the capacitors by searching such a combination of capacitors connected in parallel that a voltage created on these capacitors by redistributed charge is as close to a given reference voltage as possible. At each conversion step, a capacitor which is connected to a set of capacitors has lower capacitance compared to a capacitor connected in a previous step. If a voltage created on the set of capacitors is higher than the reference voltage, the actually connected capacitor is kept connected to the set of capacitors in next steps, and a corresponding output bit is evaluated to one. Otherwise, the actually connected capacitor is disconnected from the set of capacitors, and a corresponding output bit is evaluated to zero.

A method of representation of a value of analog signal by a compressed digital word according to A law is known from the document ITU-T G.711 "Pulse code modulation of voice frequencies". A full scale input range for positive signal values and a full scale input range for negative signal values of the analog-to-digital converter are split into eight unequal sections. The sections no. 7 correspond to upper halves of the full scale input range for absolute negative and positive values of the analog-to-digital converter. Each section of a lower index corresponds to upper halves of remaining parts of full scale input range except the section no. 0 whose range is the same as the range of the section no. 1. Each section is split into 16 quantization steps. The most significant bit of a compressed digital word according to A law represents a sign of a value of input signal. The next 3 bits represent an index of a section to which the value of input signal corresponds. The 4 least significant bits of the compressed digital word according to A law represents an index of a quantization step to which the value of input signal corresponds.

A method for conversion of a voltage value to a compressed digital word according to successive approximation scheme is known from the article Eberhard Pfrenger, Peter Picard and Frithjof von Sichart "A Companding D/A Converter for a Dual-Channel PCM CODEC", IEEE International Solid-State Circuits Conference, Feb. 16, 1978, pp. 186-187. Bits of the n-bit compressed digital word are evaluated successively by the use of a successive approximation register (SAR) starting from the most significant bit. In each step, a tested bit is set to one and provided via an expander to an input of m-bit linear digital-to-analog converter in order to create an approximation of the converted value of the analog input signal. If the created approximation is higher than the value of analog input signal, then the corresponding output bit is set to zero. Otherwise, output bit is set to one. The number of conversion steps is not lower than n+1 and independent of the value of the analog input signal.

An apparatus for conversion of a voltage value to a linear digital word according to successive approximation scheme is known from the article James McCreary, Paul R. Gray "A High-Speed, All-MOS Successive-Approximation Weighted Capacitor A/D Conversion Technique", Proceedings of IEEE International Solid-State Circuits Conference, February 1975, pp. 38-39. The aforementioned apparatus comprises a successive approximation capacitor array whose one input is connected to a source of converted input voltage, whereas the other input is connected to a source of the reference voltage while its output is connected to a control module through a comparator. The control module is equipped with a digital output and an input of the clock signal that clocks a conversion process. Two control outputs of the control module are connected to the comparator, and the other control outputs of the control module are connected to the successive approximation capacitor array.

The successive approximation capacitor array comprises a number of n capacitors of binary-weighted capacitances and an additional capacitor while the first plate of each capacitor in the array is connected to the first common rail, and the capacitance of the additional capacitor equals the capacitance of the smallest capacitor in the array. The other plates of the capacitors in the array are connected to the other common rail through the change-over switches whose other stationary contacts are connected to the ground of the circuit. The first common rail is connected to the non-inverting input of the comparator, and the second common rail is connected through another switch to the source of the input voltage or to the source of the reference voltage, while the inverting input of the comparator is connected to the ground of the circuit.

Method and apparatus for conversion of a time interval to a digital word is known from the patent document U.S. Pat. No. 9,063,518. The apparatus comprises an array of capacitors whose control inputs are connected to a set of control outputs of a control module. The control module is equipped with a digital output, a complete conversion signal output, a trigger input and two control inputs. The first control input is connected to the output of the first comparator whose inputs are connected to one pair of outputs of the array of capacitors, and the other control input of the control module is connected to the output of the second comparator whose inputs are connected to the other pair of outputs of the array. Besides, the source of auxiliary voltage together with the source of the reference voltage, the sampling capacitor, and two controlled current sources are connected to the set of capacitors while control inputs of both current sources are connected to control outputs of the control module.

An apparatus for conversion of a voltage value to a compressed digital word according to successive approximation scheme is known from the article Eberhard Pfrenger, Peter Picard and Frithjof von Sichart "A Companding D/A Converter for a Dual-Channel PCM CODEC", IEEE International Solid-State Circuits Conference, Feb. 16, 1978, pp. 186-187. The aforementioned apparatus comprises a comparator whose non-inverting input is used to provide an analog input signal. A comparator output is connected to an input of successive approximation register SAR comprising n-bit digital output, which is used to output a compressed digital word. This output is connected to n-bit input of an expander whose m-bit output of a linear digital-to-analog converter. A converter output is connected to an inverting input of the comparator.

SUMMARY OF THE INVENTION

Method for conversion of a value of an analog signal to a compressed digital word, according to the invention, uses a conversion of the value of the analog signal to a linear digital word by means of a successive approximation scheme. A number of bits of the linear digital word is not lower than m, and at the same time, the number of bits of the linear digital word is higher than a number of bits of a compressed digital word, which is not lower than n. The number of bits of the compressed digital word is not lower than n, whereas bits of the linear digital word are evaluated by the use of a linear analog-to-digital converter and are provided to a linear digital input.

The essence of the method is that the conversion of the value of the analog signal to the linear digital word is terminated by the use of a compression module when all bits of the compression word are already evaluated. A compression starts when the compression module detects an active state on a compression trigger input, and then a number equal to a difference between numbers m and v is written to a section number register in the compression module, while v is an arbitrarily chosen natural number smaller than n. After detection, on the basis of a bit ready signal, that a new output bit in the linear digital word has been evaluated by the linear analog-to-digital converter, a content of the section number register is decreased by one if a state of the new output bit equals zero. The content of the section number register is not decreased if a state of the new output bit equals one, or if the content of the section number register has been already reduced to zero, and then, in both cases, the evaluation of next v bits of the linear digital word by the linear analog-to-digital converter is awaited, and a number of occurrences of bit ready signal is counted. Afterwards, a complete conversion signal is generated by the compression module which terminates the conversion of the analog signal to the linear digital word, and introduces the linear analog-to-digital converter to a stand by state, while the states of v bits of the linear digital word evaluated recently are assigned respectively to the least significant v bites of the compressed digital word, and the content of the section number register is written to the more significant bites of the compressed digital word.

It is advantageous if the analog signal is unipolar, the compressed digital word contains a number of n=s+v bits, and a process of decreasing of the content of the section number register is started as soon as the most significant bit in the linear digital word, having a number of m bits, is evaluated by the linear analog-to-digital converter.

It is advantageous if the analog signal is bipolar, the compression word contains a number of n+1=s+v+1 bits, and a process of decreasing of the content of the section number register is started as soon as a bit following the most significant bit in the linear digital word, having a number of m+1 bits, is evaluated by the linear analog-to-digital converter, while a state of the most significant bit in the linear digital word representing a sign of an analog signal value according to a sign-magnitude format is by the use of the compression module assigned to the most significant bit of the compressed digital word having the number of m+1 bits.

Apparatus, according to invention, comprises a successive approximation analog-to-digital converter. A linear digital word output having a number of bits not lower than m is connected to a linear digital input of a compression module comprising a compressed digital output having a number of bits not lower than n. The number of bits of the linear digital input is not higher than the number of bits of a compressed digital word.

The essence of the method is that a compression module comprises a section number register. A complete conversion signal output of the compression module is connected to a complete conversion signal input of the linear analog-to-digital converter. A bit ready signal output of the linear analog-to-digital converter is connected to a bit ready signal input of the compression module.

It is advantageous if a compression trigger input of the compression module is connected to a conversion trigger input of the linear analog-to-digital converter.

It is advantageous if the compression trigger input of the compression module is connected to an analog input of the linear analog-to-digital converter.

It is advantageous if the linear analog-to-digital converter is a synchronous device, and a bit ready signal output of the linear analog-to-digital converter comprises a single line transmitting a signal that provides timing for the linear analog-to-digital converter operation.

It is advantageous if the linear analog-to-digital converter is a known asynchronous device comprising two comparators, and a bit ready signal output of the linear analog-to-digital converter contains two lines that transmit output signals of both comparators.

It is advantageous if the linear analog-to-digital converter is a converter of a unipolar input signal comprising a linear output having a number of m bits, while the compression module contains an output of the compressed digital word having a number of n bits.

It is advantageous if the linear analog-to-digital converter is a converter of a bipolar input signal comprising a linear output having a number of m+1 bits representing a sign-magnitude format, while the compression module contains an output of the compressed digital word having a number of n+1 bits.

The solution according to the invention is characterized by a reduction of the number of steps of the linear analog-to-digital conversion required for evaluation of bits of the compressed digital word. Therefore, both conversion time and energy needed to convert an analog signal value to the compressed digital word are decreased.

BRIEF DESCRIPTION OF THE DRAWINGS

The solution according to the invention is presented in the following figures.

DESCRIPTION OF THE PREFERRED EMBODIMENTS

Method for conversion of a value of an analog signal to a compressed digital word, according to the invention, adopts a conversion of a unipolar analog signal to a linear digital word using successive approximation scheme. Bits of the linear digital word LW, having a number of m=11 bits are evaluated successively using the linear analog-to-digital converter SA-ADC, and are provided to the linear digital input LW of a compression module CPM.

The conversion of a value of the analog signal to the linear digital word LW is terminated by the use of the compression module CPM as soon as all the bits of the compressed digital word CW, having a number of bits equal to 7, are evaluated. The compression process is started when an active state on a compression trigger input TrgCP is detected by the compression module CPM. Then, a number 7 equal to a difference between the numbers m=11 and v=4 is written to a section number register (RegS) in the compression module CPM, while v=4 is chosen arbitrarily. After detection, on the basis of a bit ready signal BitRdy, that a new output bit in the linear digital word LW has been evaluated by a linear analog-to-digital converter SA-ADC, a content of the section number register RegS is decreased by one if a state of the new output bit has been evaluated to zero. The reduction of the content of the section number register RegS is started as soon as the most significant bit in the linear digital word LW is evaluated on the output the linear analog-to-digital converter SA-ADC. The content of the section number register RegS is not reduced if a state of the new output bit in the linear digital word LW has been evaluated to one, or if the content of the section number register RegS has been already reduced to zero. Then, in both cases, the evaluation of the next v bits of the linear digital word LW by the linear analog-to-digital converter SA-ADC is awaited, while a number v is equal to 4, and a number of occurrences of bit ready signal BitRdy up to 4 has been counted. Afterwards, a complete conversion signal End is generated by the compression module CPM, which terminates the conversion of the analog signal value to the linear digital word LW and introduces the linear analog-to-digital converter SA-ADC to a stand by state. The states of v=4 bits of the linear digital word LW evaluated recently are assigned respectively to the least significant v=4 bites of the compressed digital word CW. The content of the section number register RegS is written to a number of s of more significant bites of the compressed digital word CW, while s is equal to 3.

In another variant of the method for conversion of a value of the analog signal to the compressed digital word, according to the invention, adopts a conversion of a bipolar analog signal to the linear digital word using successive approximation scheme. A number of m+1 bits of the linear digital word LW equals 12, and a number of n+1 bits of the compression word CW equals 8.

Figure 4:
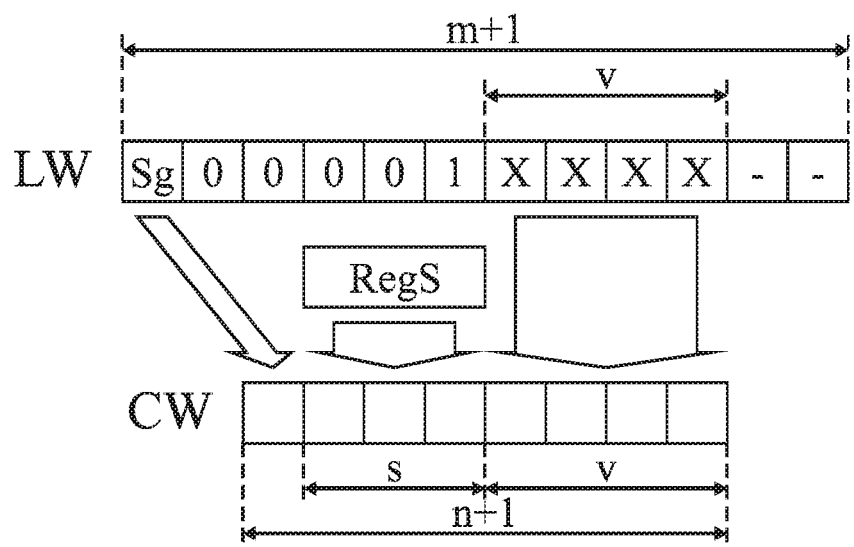
FIG. 4 illustrates a format of the linear digital word LW according to a sign-magnitude representation and the compressed digital word CW for conversion of bipolar signal.

This variant of the method differs from the previous variant in that a process of reduction of the content of the section number register RegS is started as soon as a bit following the most significant bit in the linear digital word LW has been evaluated by the linear analog-to-digital converter SA-ADC. A state of the most significant bit in the linear digital word LW representing a sign of an analog signal value Sg according to a sign-magnitude format is by the use of the compression module CPM assigned to the most significant bit of the compressed digital word CW (FIG. 4).

Figure 1:
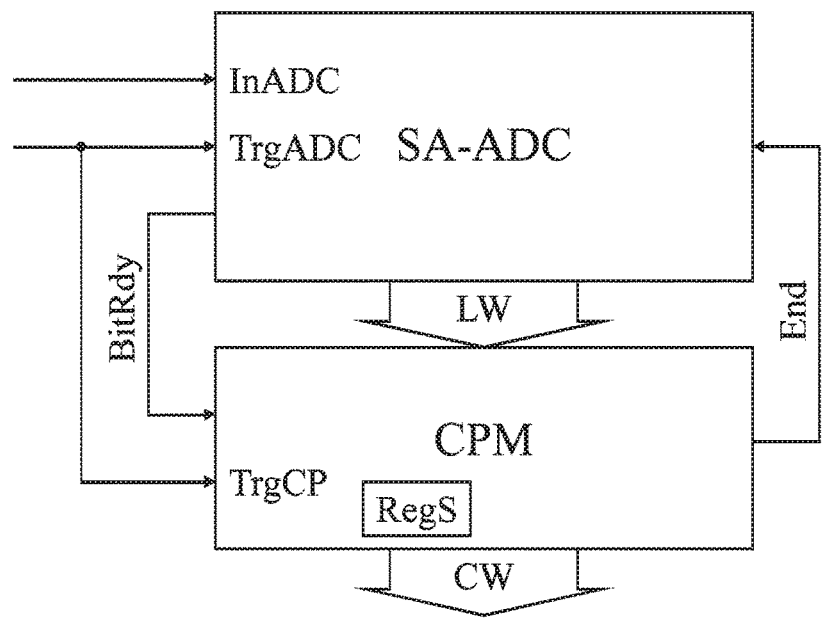
FIG. 1 illustrates the block diagram of the apparatus, in which the compression trigger input TrgCP of the compression module CPM is connected to the conversion trigger input TrgADC of the synchronous linear analog-to-digital converter SA-ADC.

The apparatus for conversion of a value of the analog signal to the compressed digital word in the first embodiment, according to the invention, comprises the 11-bit synchronous unipolar linear successive approximation analog-to-digital converter SA-ADC (FIG. 1). A linear digital word LW output of the linear analog-to-digital converter SA-ADC, having a number of bits equal to 11, is connected to a linear digital word LW input of a compression module CPM comprising a section number register RegS and a compressed digital word CW output, having a number of bits equal to 7, a and complete conversion signal output End, connected to a complete conversion signal input End of the linear analog-to-digital converter SA-ADC. A bit ready signal output BitRdy of the linear analog-to-digital converter SA-ADC comprising a single line transmitting a signal that provides timing for the linear analog-to-digital converter SA-ADC operation is connected to a bit ready signal input BitRdy of the compression module CPM. A compression trigger input TrgCP of the compression module CPM is connected to a conversion trigger input TrgADC of the linear analog-to-digital converter SA-ADC.

Figure 2:
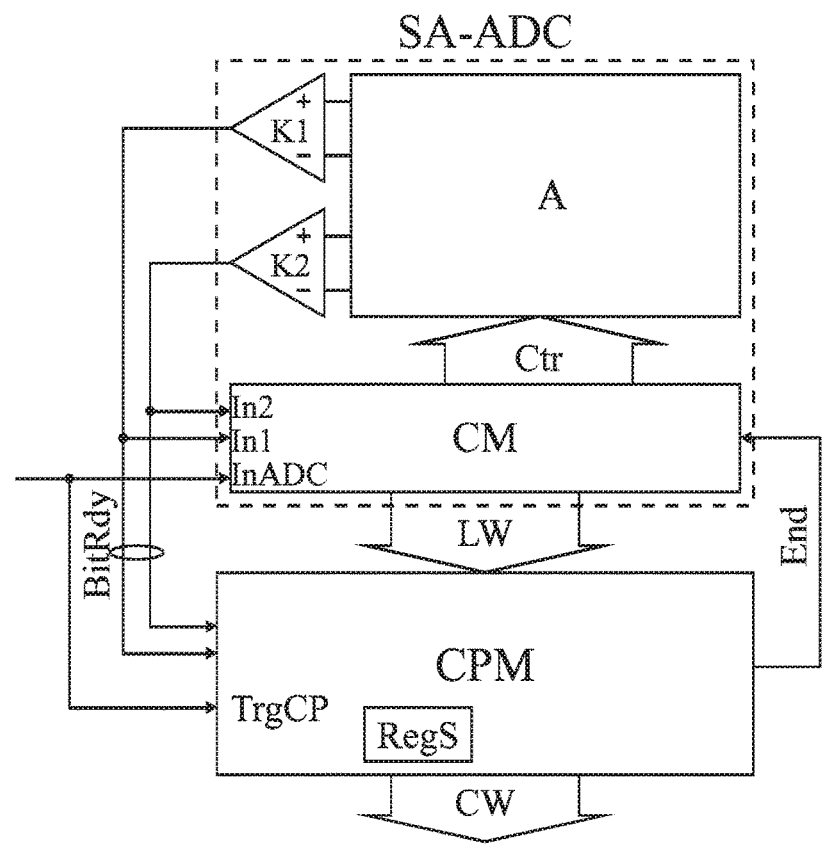
FIG. 2 illustrates the block diagram of the apparatus, in which the linear analog-to-digital converter SA-ADC is a known asynchronous device, and a bit ready signal output BitRdy contains two lines.

In the second embodiment, the apparatus comprises a known 11-bit synchronous unipolar linear successive approximation analog-to-digital converter SA-ADC comprising a set of capacitors A connected to a control module CM by the use of lines transmitting control signals Ctr (FIG. 2). A first comparator K1 and a second comparator K2 are connected to the set of capacitors A. Outputs of both comparators are connected respectively to a first input In1 and to a second input In2 of the control module CM. An output of the linear digital word LW of the control module CM, having a number of bits m equal to 11, is connected to an input of the linear digital word of the compression module CPM comprising a section number register RegS, and an output of the compressed digital word CW having a number of bits n equal to 7, and a complete conversion signal output End of the control module CM. A bit ready signal output BitRdy of the linear analog-to-digital converter SA-ADC, comprising two lines transmitting output signals both of the first comparator K1 and of the second comparator K2, is connected to a bit ready signal input BitRdy of the compression module CPM. A compression trigger input TrgCP of the compression module CPM is connected to an analog input InADC of the control module CM, which is the input for conversion of time intervals.

In the third embodiment, the apparatus differs from the first embodiment in that the apparatus comprises a 12-bit synchronous bipolar linear analog-to-digital converter SA-ADC, whose output of the linear digital word LW, having a number of bits m+1=12 is connected to the input of the linear digital word of the compression module CPM (FIG. 1). The compression module CPM comprises the output of the compressed digital word CW having a number of bits n+1=8.

The conversion of a value of the analog signal to the compressed digital word In the first embodiment is realized as follows (FIG. 1). As soon as an active state on a compression trigger input TrgCP is detected by the compression module CPM, a number m-v=7 is written to a section number register RegS in the compression module CPM. At the same time, an active state of the conversion trigger input TrgADC by the linear analog-to-digital converter SA-ADC, the conversion of a unipolar value of an analog signal provided to the analog input InADC to the linear digital word LW, having a number of bits equal to 11, according to a known successive approximation scheme, is started. The states of bits of the linear digital word LW are successively evaluated in a known way by the linear analog-to-digital converter SA-ADC, and at the same time provided to the input of the linear digital word of the compression module CPM.

The linear analog-to-digital converter SA-ADC by the use of the bit ready signal BitRdy signalizes to the compression module CPM that a new output bit in the linear digital word LW has been evaluated. As soon as the compression module CPM, on the basis of the bit ready signal BitRdy, detects that a new output bit in the linear digital word LW by the linear analog-to-digital converter SA-ADC has been evaluated, the content of the section number register RegS is decreased by one if a state of a new output bit in the linear digital word LW has been evaluated to zero, and the cycle of evaluation and the analysis of next bits are repeated. The compression module CPM terminates a process of decreasing the content of the section number register RegS if a state of a new output bit in the linear digital word LW has been evaluated to one, or if the content of the section number register actually RegS has been already reduced to zero.

Figure 3:
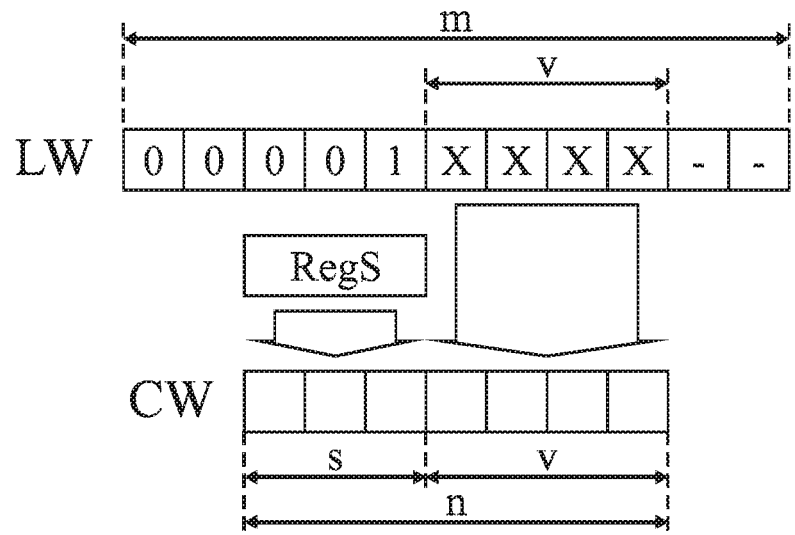
FIG. 3 illustrates a format of the linear digital word LW and the compressed digital word CW for conversion of unipolar signal.

Then, in both cases, the evaluation of the next v bits of the linear digital word LW by the linear analog-to-digital converter SA-ADC is awaited, and a number of v occurrences of the bit ready signal BitRdy is counted, while v equals 4. Afterwards, a complete conversion signal End is generated by the compression module CPM, which terminates the conversion of the analog signal to the linear digital word LW, and introduces the linear analog-to-digital converter SA-ADC to a stand by state. The states of v bits of the linear digital word LW evaluated recently are assigned by the compression module CPM respectively to the least significant v bites of the compressed word CW, while v equals 4 (FIG. 3). The content of the section number register RegS is written by the compression module CPM to the more significant s bites of the compressed word CW, while s equals 3 (FIG. 3).

The conversion of a value of an analog signal to a compressed digital word in the second embodiment (FIG. 2) is realized as follows. As soon as an active state on a compression trigger input TrgCP is detected by the compression module CPM, a number equal to 7 which is a difference between numbers m and v is written to a section number register RegS in the compression module CPM. At the same time, when a beginning of a time interval which is signalled at an analog input InADC, the linear analog-to-digital converter SA-ADC starts the conversion of the time interval provided to the analog input InADC to the linear digital word LW, having a number of bits equal to 11, according to a known successive approximation scheme. The values of bits of the linear digital word LW are successively evaluated in a known way by the linear analog-to-digital converter SA-ADC, and at the same time provided to the input of the linear digital word of the compression module CPM.

The linear analog-to-digital converter SA-ADC terminates the evaluation of the output bits when a short active state is generated on the output of the first comparator K1, or on the output of the second comparator K2. The states of the outputs of both comparators are transmitted by the use of two lines of the bit ready signal output BitRdy of the compression module CPM.

As soon as the compression module CPM, on the basis of the bit ready signal BitRdy, detects that a new output bit in the linear digital word LW by the linear analog-to-digital converter SA-ADC has been evaluated, the content of the section number register RegS is decreased by one if a state of the new output bit in the linear digital word LW has been evaluated to zero, and the cycle of evaluation and the analysis of next bits is repeated. The compression module CPM terminates a process of decreasing the content of the section number register RegS if a state of a new output bit in the linear digital word LW has been evaluated to one, or if the content of the section number register actually RegS has been already reduced to zero.

Then, in both cases, the conversion of the value of the analog signal to the compressed digital word is continued in the same way as in the first embodiment.

The conversion of a value of an analog signal to a compressed digital word in the third embodiment differs from the conversion in the first embodiment in that the compression module CPM starts the process of decreasing of the content of the section number register RegS as soon as a bit following the most significant bit in the linear digital word LW. The state of the most significant bit in the linear digital word LW representing a sign of an analog signal value Sg according to a sign-magnitude format is by the use of the compression module CPM assigned to the most significant bit of the compressed word CW (FIG. 4).

ACRONYMS

SA-ADC linear analog-to-digital converter
CPM compression module
InADC analog input
RegS section number register
LW linear digital word
CW compressed digital word
End complete conversion signal
BitRdy bit ready signal
TrgADC conversion trigger input
TrgCP compression trigger input
Sg sign of an analog signal value
A set of capacitors
CM control module
K1 first comparator
K2 second comparator
In1 first input of control module
In2 second input of control module

What is claimed is:
1. A method for conversion of a value of an analog signal to a compressed digital word with a compression ratio not higher than a ratio of two natural numbers m and n using a conversion of the analog signal to a linear digital word according to a successive approximation scheme,
   wherein a number of bits of the linear digital word is not lower than m, and, at the same time, the number of bits of the linear digital word is higher than a number of bits of the compressed digital word, and the number of bits of the compressed digital word is not lower than n, and the compressed digital word comprises a group of v bits copied directly from the linear digital word, and a number of s bits that indicates a position of the group of v bits in the linear digital word, wherein v+s=n, and the bits of the linear digital word already evaluated by the use of a linear analog-to-digital converter are provided to a linear digital input of a compression module, wherein the conversion of a value of the analog signal to the linear digital word is terminated by the use of the compression module when all bits of a compression word have been evaluated, wherein a compression starts when the compression module detects an active state on a compression trigger input, and then a number equal to a difference between numbers m and v is written to a section number register in the compression module, wherein v is an arbitrarily chosen natural number smaller than n, and, after detection, on the basis of a bit ready signal, that a new output bit in the linear digital word has been evaluated by the linear analog-to-digital converter, a content of the section number register is decreased by one if a state of the new output bit in the linear digital word has been evaluated to zero, wherein the content of the section number register is not decreased if a state of the new output bit in the linear digital word has been evaluated to one, or if the content of the section number register has been already reduced to zero, and then, in both cases, the evaluation of next v bits of the linear digital word by the linear analog-to-digital converter is awaited, and a number of v occurrences of a bit ready signal is counted, and, afterwards, a complete conversion signal is generated by the compression module, which terminates the conversion of the analog signal to the linear digital word, and introduces the linear analog-to-digital converter to a standby state, and wherein the states of v bits of the linear digital word previously evaluated are assigned by the compression module, respectively, to Least Significant v Bits of the compressed word, and the content of the section number register is written by the compression module to Most Significant Bits of the compressed word.

2. The method according to claim 1, wherein the analog signal is unipolar, the compression word contains the number of n=s+v bits, and a process of decreasing of the content of the section number register is started as soon as the most significant bit in the linear digital word, having a number of m bits, is evaluated by the linear analog-to-digital converter.

3. The method according to claim 1, wherein the analog signal is bipolar, the compression word contains a number of n+1=s+v+1 bits, and a process of decreasing of the content of the section number register is started as soon as a bit following the most significant bit in the linear digital word, having a number of m+1 bits, is evaluated by the linear analog-to-digital converter, and wherein a state of the most significant bit in the linear digital word representing a sign of an analog signal value according to a sign-magnitude format is, by the use of the compression module, assigned to the most significant bit of the compressed word having the number of m+1 bits.

4. An apparatus for conversion of a value of an analog signal to a compressed digital word with a compression ratio not higher than a ratio of two natural numbers m and n using a conversion of a value of an analog signal to a linear digital word according to a successive approximation scheme whose linear digital word output having a number of bits not lower than m is connected to a linear digital word input of a compression module comprising a compressed digital output having a number of bits not lower than n, wherein the number of bits of the linear digital word input is not higher than the number of bits of the compressed digital word, wherein the compression module comprises a section number register, and wherein a complete conversion signal output of the compression module is connected to a complete conversion signal input of a linear analog-to-digital converter, and a bit ready signal output of the linear analog-to-digital converter is connected to a bit ready signal input of the compression module.

5. The apparatus according to claim 4, wherein a compression trigger input of the compression module is connected to a conversion trigger input of the linear analog-to-digital converter.

6. The apparatus according to claim 5, wherein the compression trigger input of the compression module is connected to an analog input of the linear analog-to-digital converter.

7. The apparatus according to claim 5, wherein the linear analog-to-digital converter is a synchronous device, and a bit ready signal output of the linear analog-to-digital converter comprises a single line transmitting a signal that provides timing for the linear analog-to-digital converter operation.

8. The apparatus according to claim 7, wherein the linear analog-to-digital converter is a converter of a unipolar input signal comprising a linear output having a number of m bits, and wherein the compression module contains an output of the compressed word having a number of n bits.

9. The apparatus according to claim 7, wherein the linear analog-to-digital converter is a converter of a bipolar input signal comprising a linear output having a number of m+1 bits representing a sign-magnitude format, wherein the compression module contains an output of the compressed word having a number of n+1 bits.

10. The apparatus according to claim 5, wherein the linear analog-to-digital converter is a known asynchronous device comprising two comparators, and a bit ready signal output of the linear analog-to-digital converter contains two lines that transmit output signals of both comparators.

* * * * *